(12) United States Patent
Kim

(10) Patent No.: US 7,435,669 B2
(45) Date of Patent: Oct. 14, 2008

(54) METHOD OF FABRICATING TRANSISTOR IN SEMICONDUCTOR DEVICE

(75) Inventor: Dae Kyeun Kim, Yongin (KR)

(73) Assignee: Dongbu Electronics Co., Ltd., Seoul (KR)

( * ) Notice: Subject to any disclaimer, the term of this patent is extended or adjusted under 35 U.S.C. 154(b) by 109 days.

(21) Appl. No.: 11/024,678

(22) Filed: Dec. 30, 2004

(65) Prior Publication Data

US 2005/0142777 A1   Jun. 30, 2005

(30) Foreign Application Priority Data

Dec. 30, 2003   (KR) .................. 10-2003-0100513

(51) Int. Cl.
*H01L 21/22* (2006.01)

(52) U.S. Cl. .................. 438/549; 438/592; 438/923; 257/E21.438

(58) Field of Classification Search .................. 438/303, 438/524, 549, 551, 552, 923, 592; 257/E21.437, 257/E21.438
See application file for complete search history.

(56) References Cited

U.S. PATENT DOCUMENTS

| 4,757,026 | A | * | 7/1988 | Woo et al. | 438/231 |
| 5,334,556 | A | * | 8/1994 | Guldi | 438/308 |
| 5,770,508 | A | * | 6/1998 | Yeh et al. | 438/305 |
| 6,235,597 | B1 | * | 5/2001 | Miles | 438/303 |
| 6,635,966 | B2 | * | 10/2003 | Kim | 257/758 |

* cited by examiner

*Primary Examiner*—Chandra Chaudhari
(74) *Attorney, Agent, or Firm*—Lowe Hauptman Ham & Berner, LLP

(57) ABSTRACT

A method of fabricating a transistor in a semiconductor device. A gate oxide layer and a gate are formed on a semiconductor substrate. An oxide layer and a silicon nitride layer are stacked on the substrate. The stacked oxide and silicon nitride layers are etched back to expose a surface of the substrate. The silicon nitride layer is removed to form a gate sidewall spacer. Impurity ions are implanted into the substrate through the exposed surface of the substrate.

5 Claims, 6 Drawing Sheets

METHOD OF FABRICATING TRANSISTOR IN SEMICONDUCTOR DEVICE

BACKGROUND OF THE INVENTION (a) Field of the Invention

The present invention relates to a method of fabricating a transistor in a semiconductor device.

(b) Discussion of the Related Art

It is known to provide a junction structure during manufacture of a semiconductor device by one-step implantation. A lightly doped drain (LDD) junction structure has been proposed to reduce undesirable effects caused by reduced gate lengths.

In order to provide the LDD junction structure, two-step implantation is employed using a gate sidewall spacer. In the two-step implantation, a gate is formed by performing photolithography on polysilicon and oxide formed on a silicon substrate. Light source/drain implantation is then performed on the silicon substrate. Specifically, oxidation is performed to protect the silicon substrate and to restore an edge portion of the gate oxide layer prior to the source/drain implantation.

After completion of the light source/drain implantation, a gate sidewall spacer is formed by stacking an oxide layer and silicon nitride layer over the silicon substrate. Etching back of the stacked layers and heavy source/drain implantation are performed on the substrate to complete the junction.

During the process, the gate sidewall spacer is used as a barrier for preventing a silicide bridge between an active area (AA) and a gate polysilicon conductor from occurring in silicidation.

FIGS. 1A to 1I are cross-sectional diagrams showing a related art method of fabricating a transistor in a semiconductor device.

As shown in FIG. 1A, an oxide layer is formed on a silicon substrate 100, and a polysilicon layer is formed on the oxide layer. Photolithography is performed on the polysilicon layer and the oxide layer to form a gate oxide layer 101 and a gate 102.

As shown in FIG. 1B, an oxide layer 103 is formed on the silicon substrate 100 including exposed surfaces of the gate oxide layer 101 and the gate 102 by oxidation to restore edges of the gate oxide layer 101 and to protect the silicon substrate 100.

As shown in FIG. 1C, light ion implantation is performed on the silicon substrate 100 to lightly doped regions 104. An oxide layer 105 and a silicon nitride layer 106 are stacked over the substrate 100, as shown in FIG. 1D.

As shown in FIG. 1E, the oxide layer 105 and the silicon nitride layer 106 are etched back to remain on a sidewall of the gate 102 and the gate oxide layer 101. By this process, a gate sidewall spacer 106/105 is formed.

As shown in FIG. 1F, heavy ion implantation is performed on the silicon substrate 100 to form heavily doped regions 107 adjacent to the lightly doped regions 104, respectively. Silicidation is performed on the gate 102 and the heavily doped regions 107 to form a silicide layer 108, as shown in FIG. 1G.

As shown in FIG. 1H, a premetal dielectric (PMD) layer 109 is formed on the silicon substrate 100 including the silicide layer 108. FIG. 1I shows an insulating interlayer 110 formed on the PMD layer 109. However, since a space between the gates is narrowed due to the gate sidewall spacer 106/105 and the PMD layer 109, a void V1 is formed while depositing the insulating interlayer 110.

The void V1 can generate cracks or bridges in subsequent thermal and contact processes, thus lowering the yield and reliability of the semiconductor device.

SUMMARY OF THE INVENTION

To address the above-described and other problems, it is an object of the present invention to provide a method of fabricating a transistor in a semiconductor device. A gate oxide layer and a gate are formed on a semiconductor substrate. An oxide layer and a silicon nitride layer are stacked on the substrate. The stacked oxide and silicon nitride layers are etched back to expose a surface of the substrate. The silicon nitride layer is removed to form a gate sidewall spacer. Impurity ions are implanted into the substrate through the exposed surface of the substrate.

It is to be understood that both the foregoing general description of the invention and the following detailed description are exemplary, but are not restrictive of the invention.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE INVENTION

Embodiments of the present invention are described with reference to the accompanying drawings. It is to be understood that the invention is not limited to the disclosed embodiments, but rather is intended to cover various modifications and arrangements within the scope of the claims. The same reference numbers are used throughout the drawings to refer to the same or like parts.

FIGS. 2A to 2H are cross-sectional diagrams showing a method of fabricating a transistor in a semiconductor device according to the present invention.

Figure 1A:
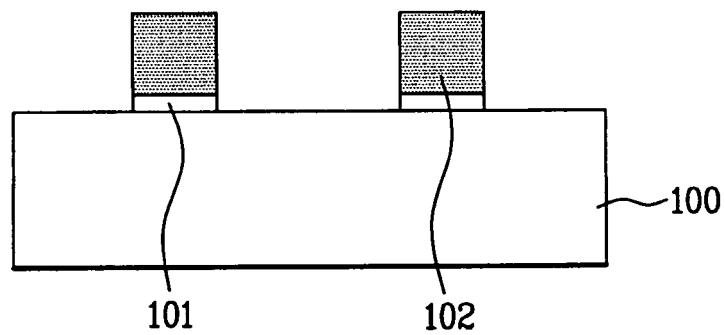
FIGS. 1A to 1I are cross-sectional diagrams showing a related art method of fabricating a transistor in a semiconductor device.
Figure 1B:
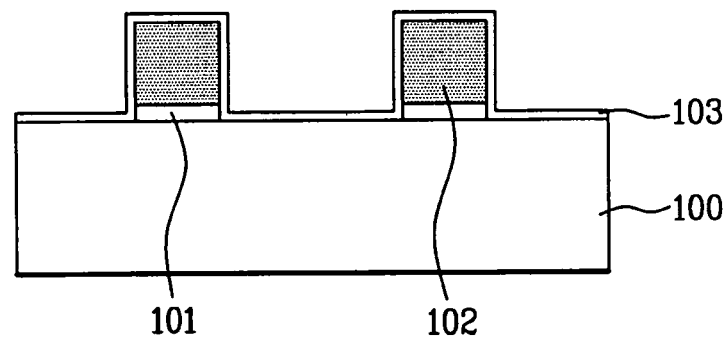
Figure 1C:
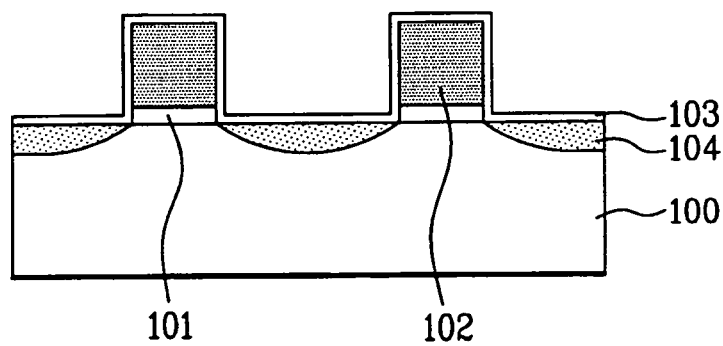
Figure 1D:
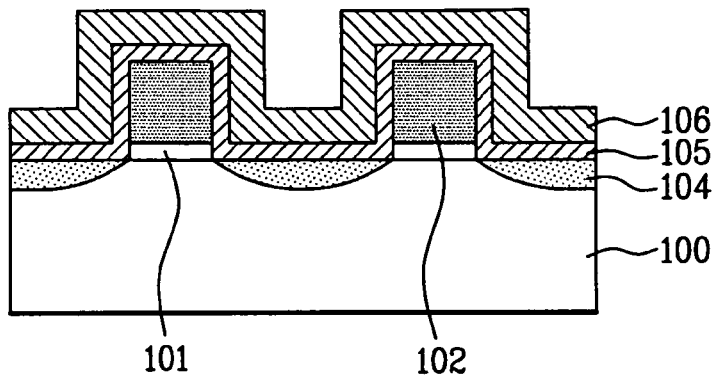
Figure 1E:
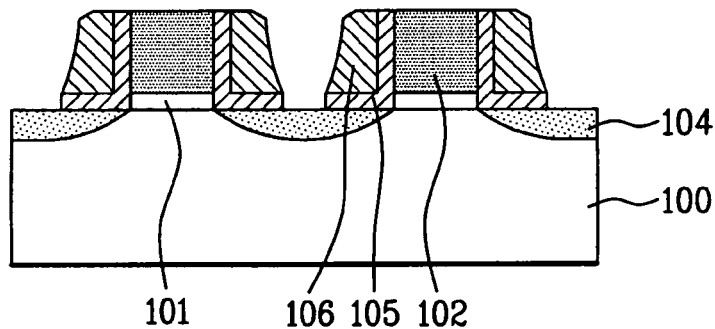
Figure 1F:
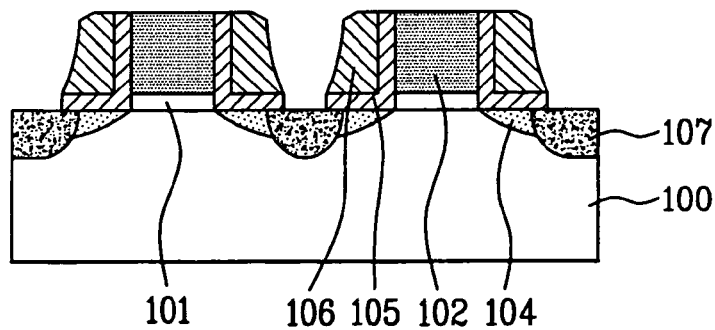
Figure 1G:
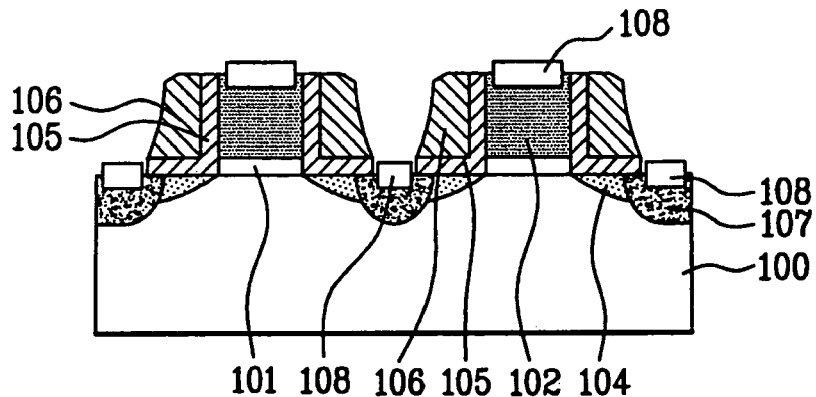
Figure 1H:
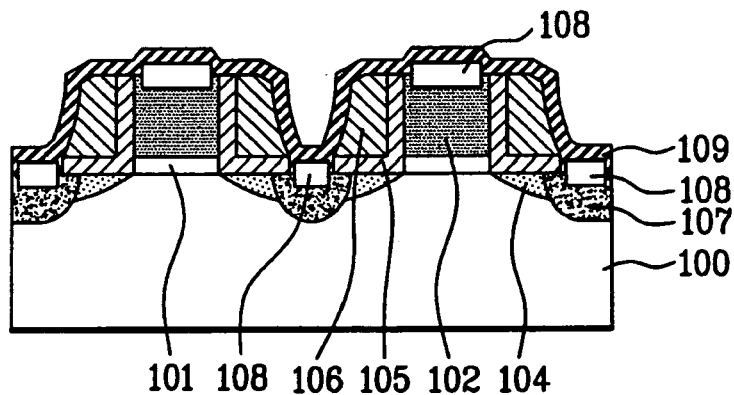
Figure 1I:
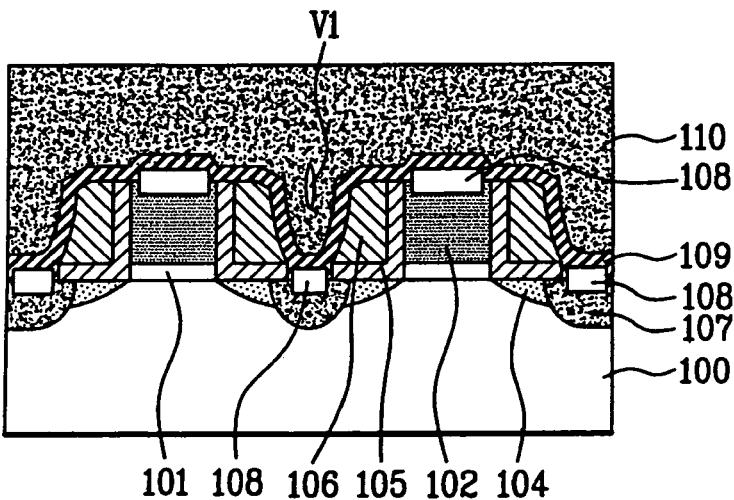
Figure 2A:
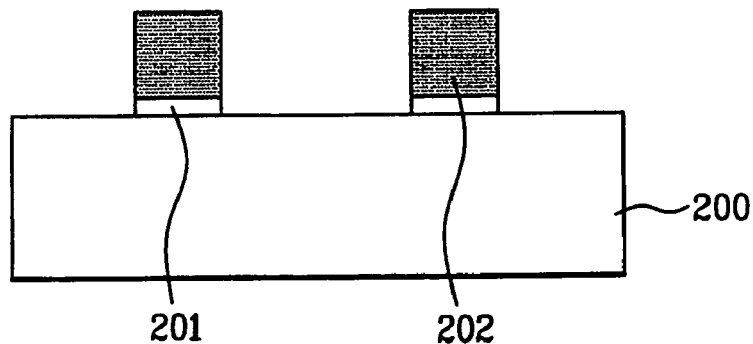
FIGS. 2A to 2H are cross-sectional diagrams showing a method of fabricating a transistor in a semiconductor device according to the present invention.

As shown in FIG. 2A, an oxide layer is formed on a semiconductor substrate 200, and a polysilicon layer is formed on the oxide layer. Photolithography is performed on the polysilicon layer and the oxide layer to form a gate oxide layer 201 and a gate 202. Preferably, the substrate 200 is a silicon substrate.

Figure 2B:
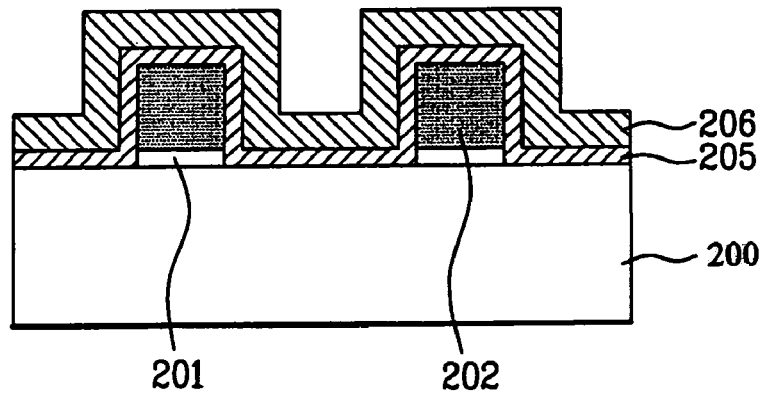

As shown in FIG. 2B, an oxide layer 205 and a silicon nitride layer 206 are stacked on the substrate 200. In this case, the oxide layer 205 is formed for a gate sidewall spacer and the silicon nitride layer 206 is a sacrifice layer. Specifically, a thickness of the oxide layer 205 corresponds to an amount and depth profile of impurity ions subsequently provided by ion implantation, and a thickness of the silicon nitride layer 206 corresponds to a size of the oxide layer 205 subsequently patterned. Further, a predetermined size of the oxide layer 205 will determine a range of an area of the substrate in which the impurity ions are subsequently implanted and prevent the impurity ions from diffusing into and/or beneath the gate oxide layer 201 to avoid parasitic capacitance.

Figure 2C:
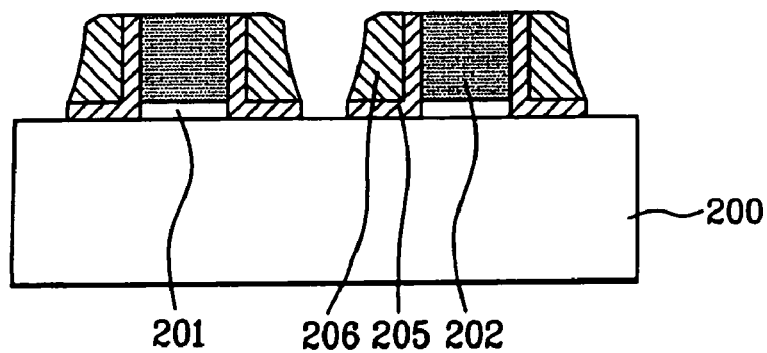

As shown in FIG. 2C, the nitride layer 206 and the oxide layer 205 are etched back to remain on a sidewall of the gate 202 and the gate oxide layer 201. A surface of the substrate 200 acts as an etch-stop layer. A gate sidewall spacer, including layers 206 and 205, is formed, and a portion of the substrate 200 between the gates 202 is exposed.

Figure 2D:
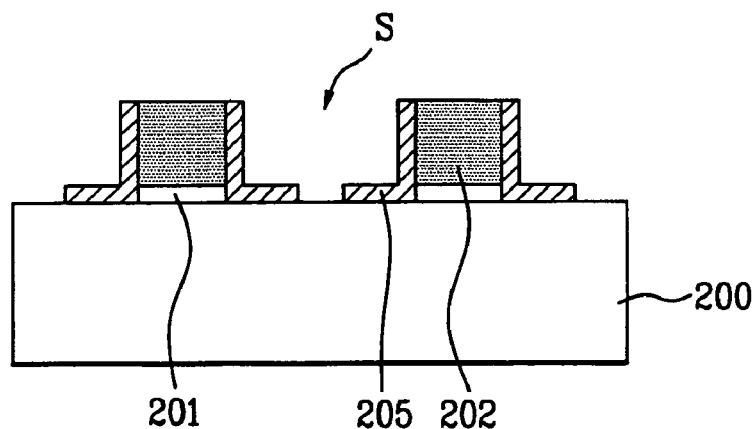

As shown in FIG. 2D, the remaining silicon nitride layer 206 in FIG. 2C is removed, preferably by a wet etch process. By this process, a sufficient space S can be provided between the gates 202 including the gate sidewall spacer 205.

Figure 2E:
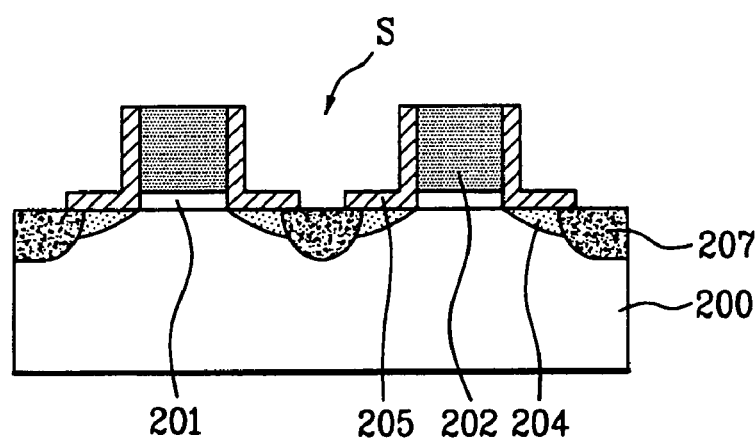

As shown in FIG. 2E, ion implantation is performed on the substrate 200 using the gate sidewall spacer 205 as an ion implantation mask. Thus, ion-implanted source/drain regions 207 and 204 are formed in the substrate 200. Alternately, additional oxidation can be performed on the substrate 200 to adjust densities of the source/drain junctions 207 and 204.

Figure 2F:
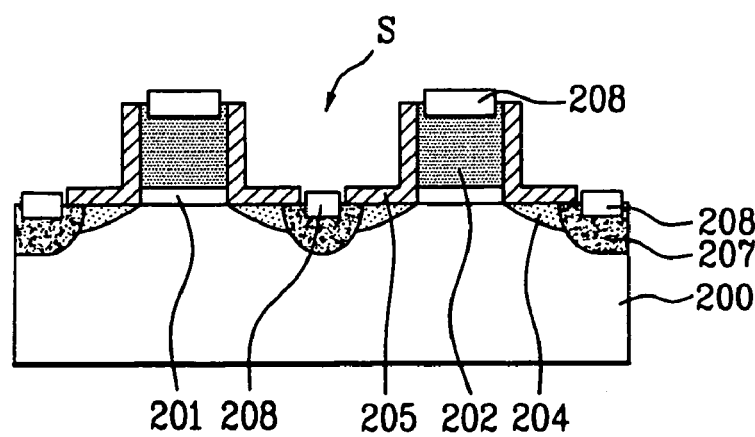
Figure 2G:
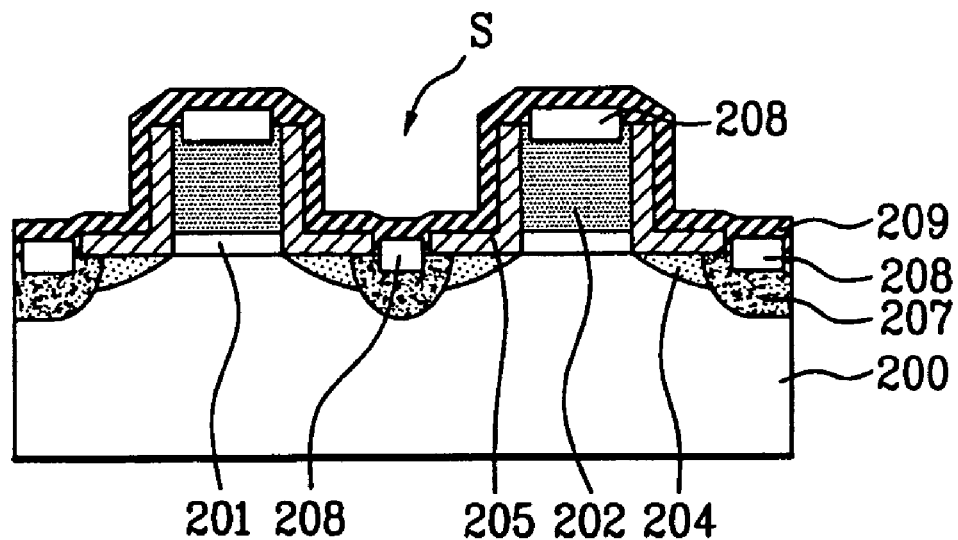
Figure 2H:
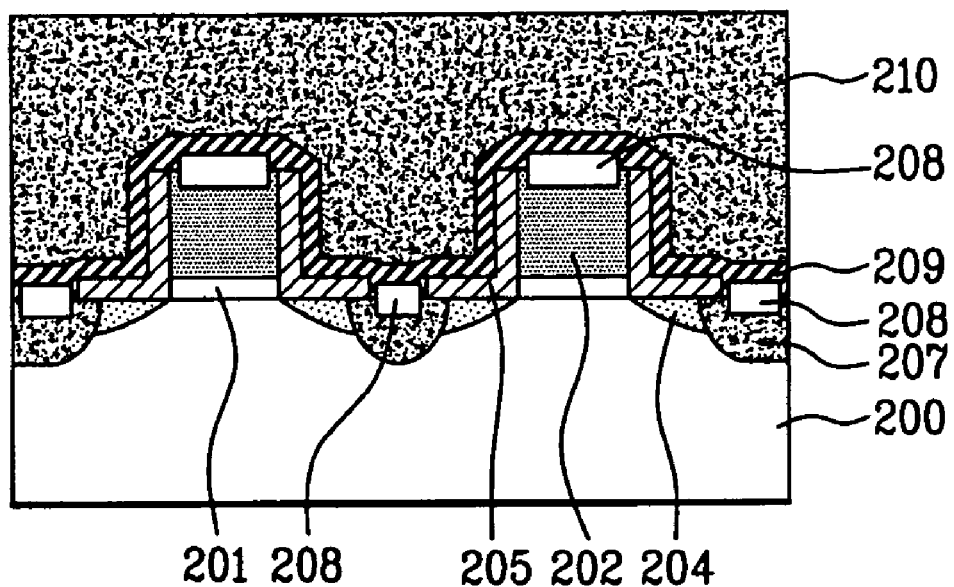

As shown in FIG. 2F, silicidation is performed on the gate 202 and the source/drain regions 207 to form a silicide layer 208. A premetal dielectric (PMD) layer 209 is formed on the substrate 200 including the silicide layer 208, as shown in FIG. 2G. As shown in FIG. 2H, an insulating interlayer 210 is formed on the PMD layer 209. The insulating layer 210 is planarized and wiring is then performed to complete a logic process.

As discussed above, a size of the source/drain region 204 for a LDD can be adjusted by the thickness of the silicon nitride layer 206, as shown in FIG. 2C. Further, an overlap capacitance generated from the diffusing implanted ions under the gate can be controlled by adjusting the thickness of the oxide layer 205.

Additionally, when the gate sidewall spacer does not sufficiently adjust densities between heavily and lightly doped regions, additional thermal oxidation can be selectively performed on the exposed surface of the silicon substrate to facilitate the barrier material adjustment in the ion implanted regions. Still further, the space S of sufficient size can be provided by removing the silicon nitride layer 206 in FIG. 2C prior to ion implantation, such that voids can be prevented from being formed while gap-filling using the insulating interlayer 210.

Accordingly, the present invention provides the following advantages or effects.

The impurity ion profile and density in silicon can be adjusted according to a kind, shape, and/or thickness of the material on the silicon, and the space between gates can be sufficiently secured to avoid the formation of voids, such that device reliability can be enhanced.

The space of a sufficient size can be provided between the gate and a device isolation layer defining the active area of the substrate, such that a contact margin can be enhanced relative to a contact margin of the conventional device.

Additionally, the gate sidewall space can prevent the impurity ions from diffusing beneath the gate oxide layer, i.e., into the channel region, such that the impurity ions are not overlapping the gate. Thus, parasitic capacitance is avoided, and device performance is enhanced.

It will be apparent to those skilled in the art that various modifications and variations can be made in the present invention. Thus, it is intended that the present invention covers the modifications and variations of this invention provided they come within the scope of the appended claims and their equivalents.

This application incorporates by reference herein in its entirety, Korean Application No. P2003-0100513, filed on Dec. 30, 2003.

What is claimed is:

1. A method of fabricating a transistor in a semiconductor device, comprising:

forming a gate oxide layer and a gate on a semiconductor substrate;

stacking an oxide layer and a silicon nitride layer on the substrate;

etching back the stacked oxide and silicon nitride layers to expose a surface of the substrate;

removing the silicon nitride layer to form a gate sidewall spacer;

oxidizing the exposed surface of the substrate only to adjust an amount of impurity ions to be implanted;

implanting impurity ions into the substrate through the exposed surface of the substrate;

performing silicidation on the substrate by using the gate sidewall spacer as a silicidation barrier;

forming a premetal dielectric layer over the substrate; and performing wiring on the substrate.

2. The method according to claim 1, wherein during the step of implanting impurity ions a density and depth profile of the implanted impurity ions are controlled using a thickness of the oxide layer.

3. The method according to claim 1, wherein during the step of removing the silicon nitride layer a size of the gate sidewall spacer is controlled using a thickness of the silicon nitride layer.

4. The method according to claim 1, wherein during the step of implanting impurity ions a range of the implanted impurity ions is controlled using a size of the gate sidewall spacer.

5. The method according to claim 1, wherein during the step of removing the silicon nitride layer the gate sidewall spacer is formed to prevent the impurity ions from diffusing beneath the gate oxide layer.

* * * * *